United States Patent
Yang et al.

(10) Patent No.: US 9,972,529 B2
(45) Date of Patent: May 15, 2018

(54) METHOD OF FORMING METAL INTERCONNECTION

(71) Applicant: Taiwan Semiconductor Manufacturing Company, Ltd., Hsin-Chu (TW)

(72) Inventors: Shin-Yi Yang, New Taipei (TW); Ming-Han Lee, Taipei (TW); Shau-Lin Shue, Hsinchu (TW); Tz-Jun Kuo, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days. days.

(21) Appl. No.: 14/867,872

(22) Filed: Sep. 28, 2015

(65) Prior Publication Data

US 2017/0092536 A1    Mar. 30, 2017

(51) Int. Cl.
*H01L 21/768* (2006.01)
*H01L 23/532* (2006.01)

(52) U.S. Cl.
CPC .. *H01L 21/76831* (2013.01); *H01L 21/76844* (2013.01); *H01L 21/76855* (2013.01); *H01L 23/53238* (2013.01); *H01L 23/53252* (2013.01); *H01L 23/53266* (2013.01)

(58) Field of Classification Search
CPC .............................. H01L 21/76865
See application file for complete search history.

(56) References Cited

U.S. PATENT DOCUMENTS

| | | | |
|---|---|---|---|
| 7,667,271 B2 | 2/2010 | Yu et al. |
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |

(Continued)

OTHER PUBLICATIONS

Takamasa Usui, Hayato Nasu, Shingo Takahashi, Noriyoshi Shimizu, T. Nishikawa, Masaki Yoshimaru, Hideki Shibata, Makoto Wada, and Junichi Koike, Highly Reliable Cooper Dual-Damascene Interconnects with Self-Formed $MnSi_xO_y$, IEEE Transctions on Electron Devices, vol., 53, No. 10, Oct. 2006, pp. 2492-2499.

(Continued)

*Primary Examiner* — Peniel M Gumedzoe
*Assistant Examiner* — Christopher Johnson
(74) *Attorney, Agent, or Firm* — Haynes and Boone, LLP

(57) ABSTRACT

A method of fabricating a semiconductor device is disclosed. The method includes forming a first conductive feature over a substrate, forming a dielectric layer over the first conductive feature, forming a via trench in the dielectric layer, forming a first barrier layer in the via trench. Therefore the first barrier has a first portion disposed over the dielectric layer and a second portion disposed over the first conductive feature, applying a thermal treatment to convert the first portion of the barrier layer to a second barrier layer and exposing the first conductive feature in the via trench while a portion of the second barrier layer is disposed over the dielectric layer.

20 Claims, 9 Drawing Sheets

(56) References Cited

U.S. PATENT DOCUMENTS

| | | |
|---|---|---|
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wenn et al. |
| 8,823,065 B2 | 9/2014 | Wang et al. |
| 8,860,148 B2 | 10/2014 | Hu et al. |
| 2010/0078818 A1* | 4/2010 | Ishizaka ............ H01L 21/76831 257/751 |
| 2011/0163062 A1* | 7/2011 | Gordon .................. C23C 16/18 216/13 |
| 2014/0001574 A1 | 1/2014 | Chen et al. |
| 2014/0084375 A1* | 3/2014 | Lee ...................... H01L 23/481 257/368 |
| 2014/0110755 A1 | 4/2014 | Colinge |
| 2014/0151812 A1 | 6/2014 | Liaw |
| 2015/0108646 A1* | 4/2015 | Chae .................. H01L 23/5226 257/751 |
| 2015/0262860 A1* | 9/2015 | Kao .................... H01L 21/7682 257/774 |

OTHER PUBLICATIONS

Tejaswi K. Indukuri et al., "Electrical and Reliability Characterization of CuMn Self Forming Barrier Interconnects on Low-K CDO Dielectrics, "Microelectronic Engineering 92 (2012), pp. 49-52.

\* cited by examiner

METHOD OF FORMING METAL INTERCONNECTION

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, challenges rise to develop robust process for forming metal interconnections with low resistance.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
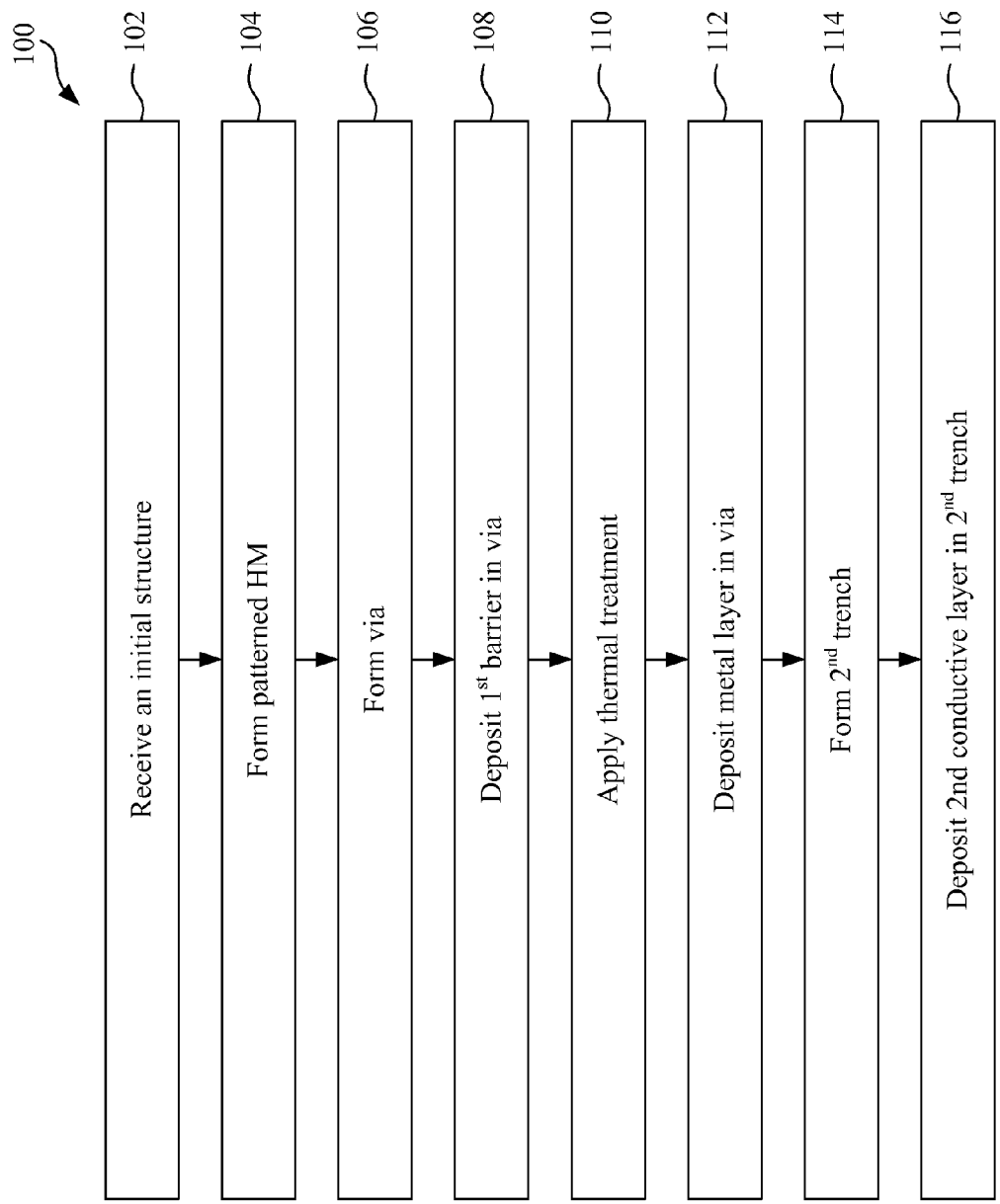
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a flowchart 100 of fabricating one or more semiconductor devices in accordance with some embodiments. The method 100 is discussed in detail below, with reference to an initial structure 205 of a semiconductor device 200 showed in FIG. 2. FIGS. 3, 4, 5, 6, 7, 8A and 8B illustrate sectional views of the semiconductor device 200 during various fabrication stages and constructed according to various aspects of the present disclosure in one or more embodiments. The method 100 and the semiconductor device 200 are collectively described below with reference to FIGS. 1 through 8A and 8B. Additional steps can be provided before, during, and after the method 100, and some of the steps described can be replaced or eliminated for additional embodiments of the method. The discussion that follows illustrates various embodiments of the semiconductor device 200 that can be fabricated according to the method 100 of FIG. 1.

Figure 2:
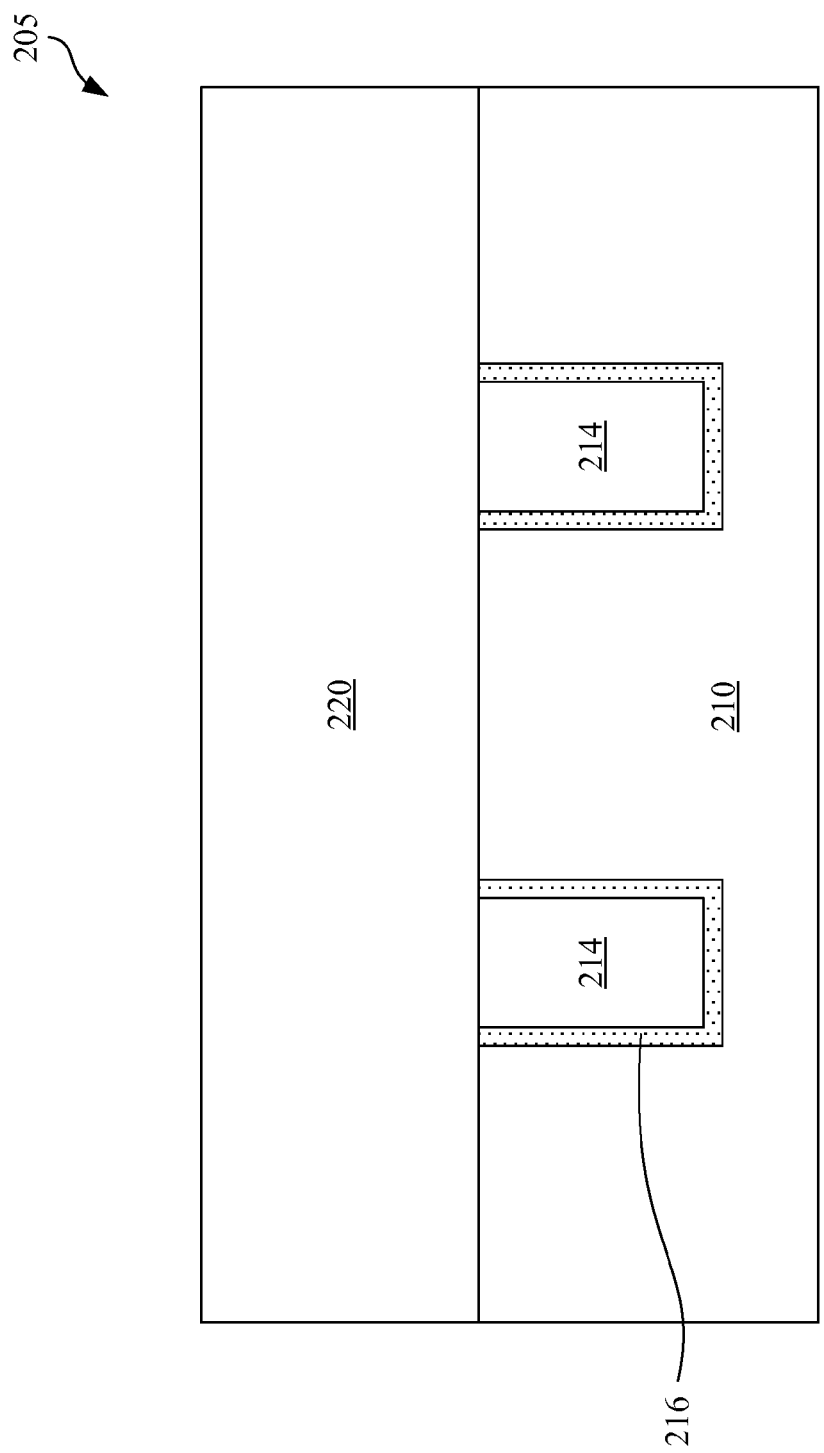
FIGS. 2, 3, 4, 5, 6, 7, 8A and 8B are cross-sectional views of an exemplary semiconductor device in accordance with some embodiments.

Referring to FIGS. 1 and 2, the method 100 starts at step 102 by providing the initial structure 205. The initial structure 205 includes a substrate 210, which may include silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate. The substrate 210 may further include lateral isolation features provided to separate various devices formed in the substrate 210. In one embodiment, shallow trench isolation (STI) features are used for lateral isolation. The various IC devices may further include other features, such as silicide disposed on S/D and gate stacks overlying channels.

The initial structure 205 may also include a plurality of dielectric layers and conductive features integrated to form an interconnect structure configured to couple the various p-type and n-type doped regions and the other functional features (such as gate electrodes), resulting a functional integrated circuit. In one example, the initial structure 205 may include a portion of the interconnect structure and is collectively referred to as the substrate 210. The interconnect structure is further described later.

As noted above, the substrate 210 includes an interconnect structure. The interconnect structure includes a multi-layer interconnect (MLI) structure and an inter-level dielectric (ILD) integrated with the MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

Exemplary conductive features 214 are shown in FIG. 2 for illustration. In one embodiment, the conductive features 214 include a portion of the interconnect structure. For example, the conductive feature 214 includes a contact, a metal via, or a metal line. The conductive feature 214 may include aluminum (Al), copper (Cu), and/or tungsten (W). In another embodiment, the conductive feature 214 includes an electrode of a capacitor, a resistor or a portion of a resistor. Alternatively, the conductive features 214 include a doped region (such as a source or a drain), or a gate electrode. In another example, the conductive features 214 are silicide features disposed on respective source, drain or gate electrode. The silicide feature may be formed by a self-aligned silicide (salicide) technique.

In some embodiments, the conductive features 214 may be further surrounded by a barrier layer 216 to prevent diffusion and/or provide material adhesion. The barrier layer 216 may include titanium nitride (TiN), tantalum nitride (TaN), tungsten nitride (WN), titanium silicon nitride (TiSiN), and/or tantalum silicon nitride (TaSiN). The conductive features 214 and the barrier layer 216 may be formed by a procedure including lithography, etching and deposition. An example lithography process may include coating, exposure, post exposure baking, and developing processes. The etch process may include a wet etch, a dry etch, and/or a combination thereof. The deposition technique may include physical vapor deposition (PVD), chemical vapor deposition (CVD), metal-organic chemical vapor deposition (MOCVD) and atomic layer deposition (ALD), and/or other suitable technique.

The initial structure 205 also includes a dielectric layer 220 deposited over the substrate 210, including over the conductive features 214. The dielectric layer 220 may one dielectric material layer, such as silicon oxide, silicon nitride, a dielectric material layer having a dielectric constant (k) lower than thermal silicon oxide (therefore referred to as low-k dielectric material layer), or other suitable dielectric material layer. In various examples, the low k dielectric material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials as examples. In another example, the low k dielectric material may include an extreme low k dielectric material (XLK). In another example, the low k dielectric material layer includes a porous version of an existing Dow Corning dielectric material called FOX (flowable oxide) which is based on hydrogen silsesquioxane. A process of forming the first dielectric material layer 220 may utilize spin-on coating or CVD. In one example, a chemical mechanical polishing (CMP) process may be used to further planarize the top surface of the first dielectric material layer 220.

Figure 3:
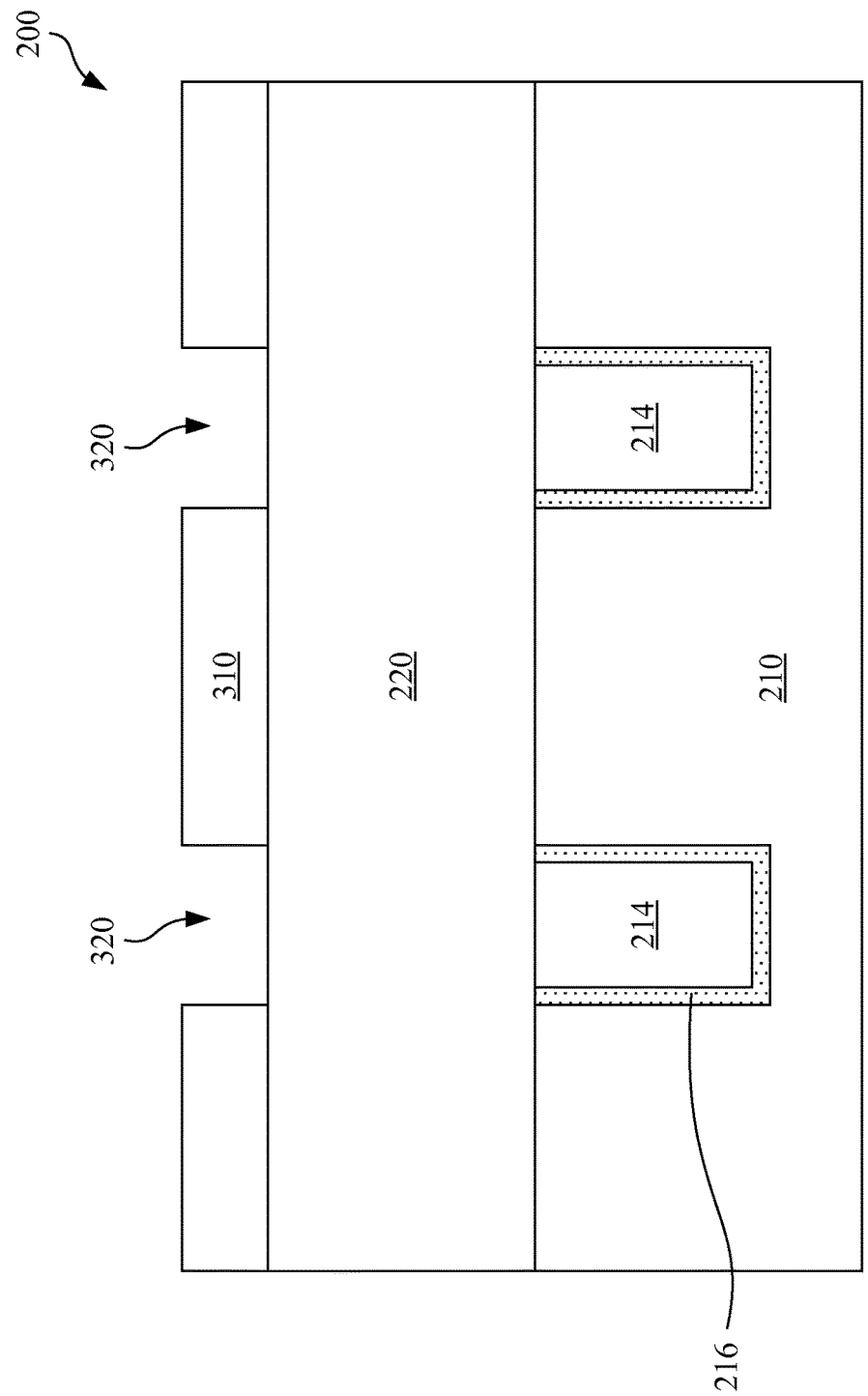

Referring to FIGS. 1 and 3, once the initial structure 205 is received, the method of 100 proceeds to step 104 by forming a patterned hard mask (HM) 310 over the dielectric layer 220. The patterned HM 310 includes various openings 320 that define portions of the dielectric layer 220 for vias and expose those portions for a subsequent etch. As shown, the openings 320 are aligned with respective conductive features 214.

In one embodiment, the patterned HM 310 is a patterned photoresist layer formed by a procedure including coating, exposure, post exposure baking, and developing. In another embodiment, the second HM 310 is formed by depositing a sub-HM layer over the dielectric layer 220, depositing photoresist layer over the sub-HM layer, patterning the photoresist layer, then etching the sub-HM layer through patterned photoresist layer to pattern the sub-HM layer and then etching the second HM 310 through the patterned sub-HM layer to form the first opening 320 in the second HM 310.

Figure 4:
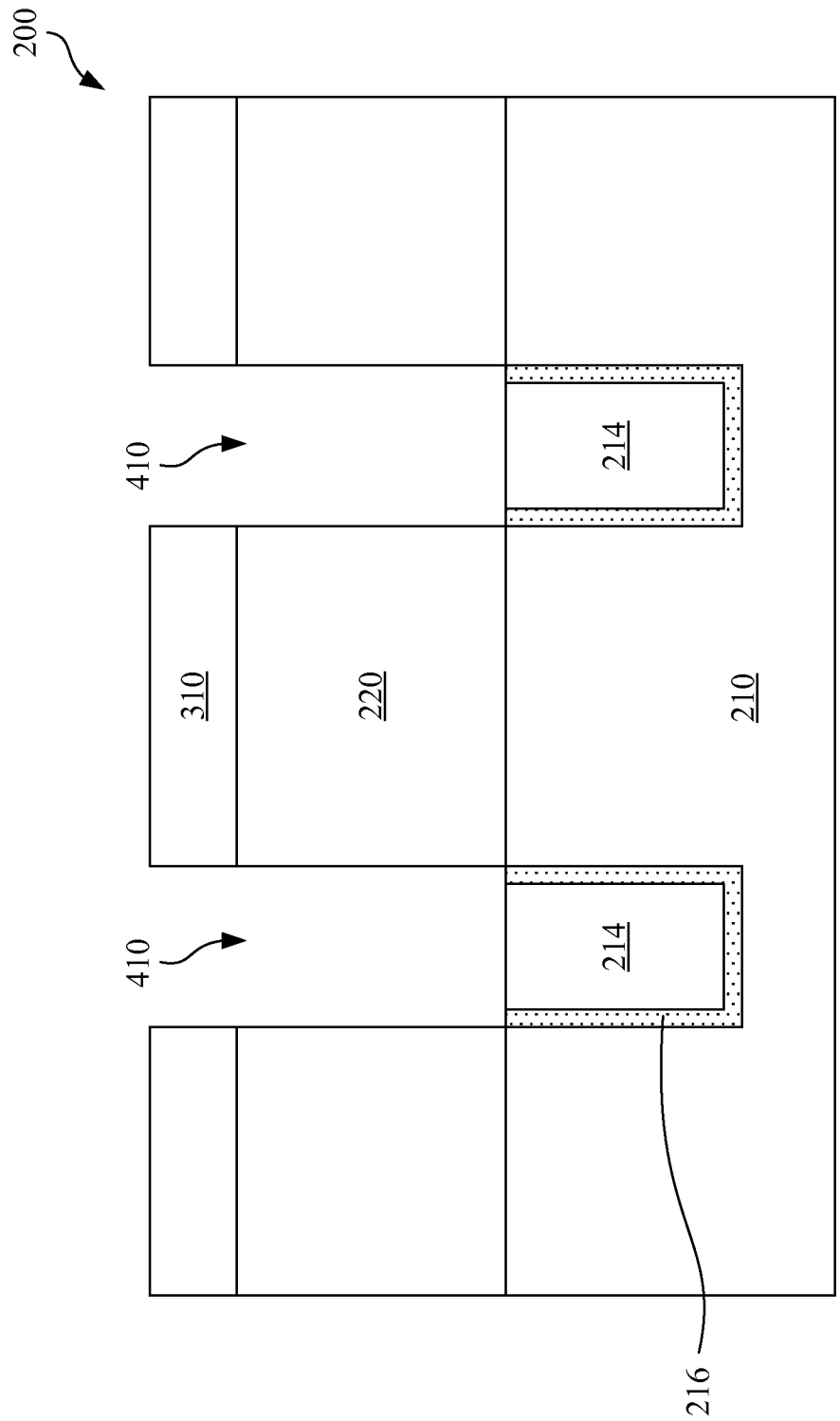

Referring to FIGS. 1 and 4 the method 100 proceeds to step 106 by etching the dielectric layer 220 through the openings 320 using the patterned HM 310 as an etch mask, resulting in one or more vias 410. As shown, vias 410 extend through dielectric layer 220 to expose respective conductive features 214. The via etch may include a selective wet etch, a selective dry etch, and/or a combination thereof. As an example, via etch includes a plasma dry etching process using a fluorine-based chemistry, such as $CF_4$, $SF_6$, $CH_2F_2$, $CHF_3$, and/or $C_2F_6$. The respective etch process may be tuned with various etching parameters, such as etchant used, etching temperature, etching solution concentration, etching pressure, etchant flow rate, and/or other suitable parameters.

After forming vias 410, the patterned HM 310 is removed by an etch process. In one example where the second HM 310 is a photoresist pattern, it is removed by wet stripping and/or plasma ashing.

Figure 5:
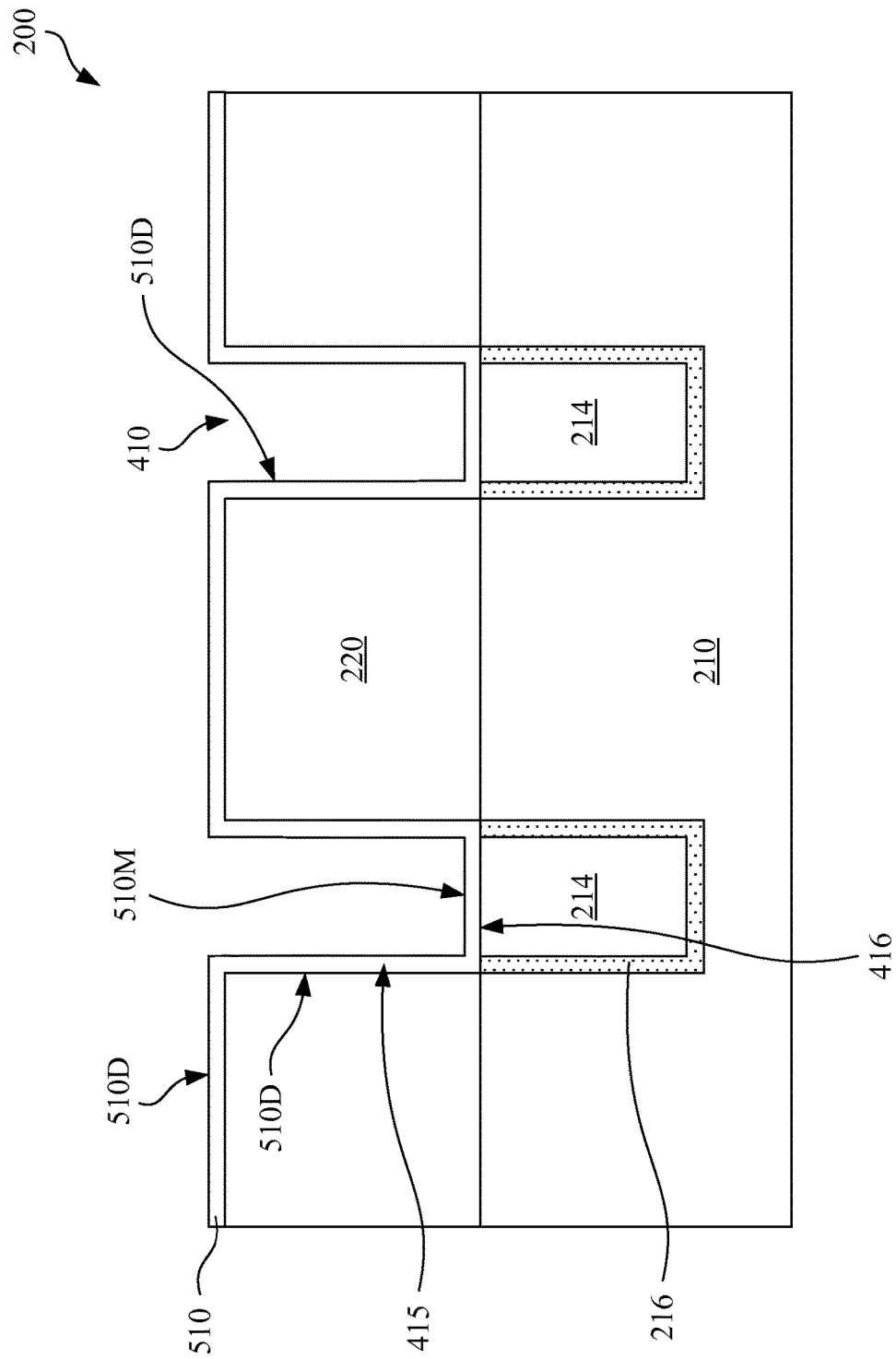

Referring to FIGS. 1 and 5, the method 100 proceeds to step 108 by depositing a first barrier layer 510 in vias 410, as well as on the top of the dielectric layer 220. In some embodiments, the first barrier layer 510 includes metal that is electrically conductive but does not permit inter-diffusion and reactions between the dielectric layer 220 and a metal layer to be filled in vias 410. The first barrier layer 510 may include manganese (Mn), manganese nitride (MnN), titanium (Ti), tantalum (Ta), cobalt (Co), cobalt tungsten (CoW), molybdenum (Mo), and/or other suitable conductive material. The first barrier layer 510 may be deposited by ALD, PVD, CVD, MOCVD, and/or plating. In some embodiment, the first barrier 510 is deposited by ALD to achieve good step coverage with a quite thin thickness. As an example, the first barrier layer 510 includes MnN layer deposited by ALD.

In the present embodiment, the first barrier layer 510 is conformably deposited along and physical contacts sidewalls 415 and bottom 416 of vias 410. Therefore, a first portion of the first barrier layer 510 extending along sidewalls 415 physically contacts the dielectric layer 220 while a second portion of the first barrier layer 510 extending along the bottom of the via physically contacts the conductive feature 214. For the sake of clarity and simplicity, the first portion is designated with the reference numeral 510D while the second portion is designated with the reference numeral 510M.

The resistance of a bottom barrier layer deposited on the bottom of vias 410 is usually much higher than a resistance of a metal layer deposited in vias 410 over such a bottom barrier layer. Therefore, the resistance of a bottom barrier layer dominates a resistance of a conductive interconnection formed by the combination of the bottom barrier layer and the metal layer. This resistance is referred to as via resistance. In the present embodiment, the method 100 provides a bottom-barrier-free scheme.

Figure 6:
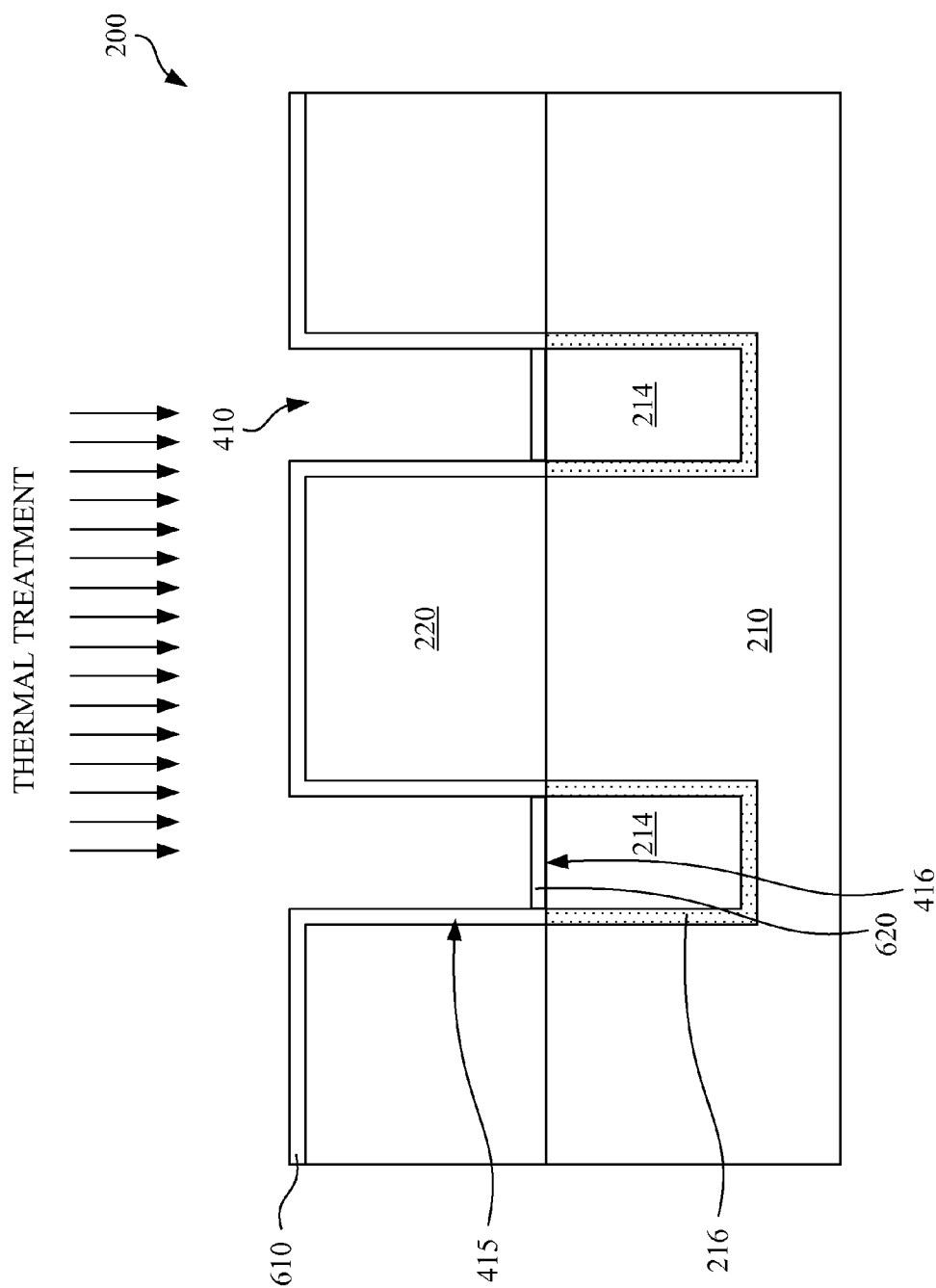

Referring to FIGS. 1 and 6, the method 100 proceeds to step 110 by performing a thermal treatment to transform (or convert) the first portion 510D and the second portion 510M into different barrier layers. In some embodiments, during the thermal treatment, the first portion 510D reacts with the dielectric layer 220 to thereby transform into a second barrier layer 610 while the second portion 510M reacts with the conductive feature 214 to thereby transform into a third barrier layer 620 (or bottom-barrier layer). In such an embodiment, the second barrier layer 610 is formed of a different material than the third barrier layer 620.

Alternatively, in some embodiments, during the performance of the thermal treatment to transform (or convert) the first portion 510D into the second barrier 610, the second portion 510M remains intact and the third barrier layer 620 is formed of the same material as the first barrier 510.

In the present embodiment, the second barrier layer 610 has a substantial different etch selectivity comparing with the third barrier layer 620 in a subsequent etch. The first barrier layer 510 and the dielectric layer 220 are chosen such that the second barrier 610 forms with an adequate ability to prevent inter-diffusion and reactions between the dielectric layer 220 and a metal layer to be filled in the vias 410. As an example, the first barrier layer 510 includes MnN while the dielectric layer 220 includes silicon oxide. After the thermal treatment, the first portion 510D converts to $MnSi_xO_yN_z$ while the second portion 510M has almost no reaction with the conductive feature 214 and thus the third barrier layer 620 remains as the MnN layer 510M. Here, x represents Si composition in atomic percent, y represents oxygen composition in atomic percent and z represents nitrogen composition in atomic percent.

With the thermal treatment, the second barrier layer 610 and third barrier layer 620 are formed with self-selective-formation nature, which provides process simplicity and relaxes process constrains. Especially, converting by the thermal treatment, the second barrier layer 610 may carry film characteristics of the first barrier layer 510, such as good step coverage with a thin thickness, which provides a good sidewall protection for a metal layer to be filled in the vias 410 and avoids formation of overhang.

The thermal treatment may comprise a rapid thermal anneal (RTA), a laser anneal, a furnace anneal, and/or a flash lamp anneal. As an example, the thermal treatment is performed, with a temperature range from 100° C. to 400° C., by using noble gases such as helium (He), neon (Ne), argon (Ar), krypton (Kr), xenon (Xe) and nitrogen ($N_2$). As another example, the thermal treatment is performed in a vacuum environment.

Figure 7:
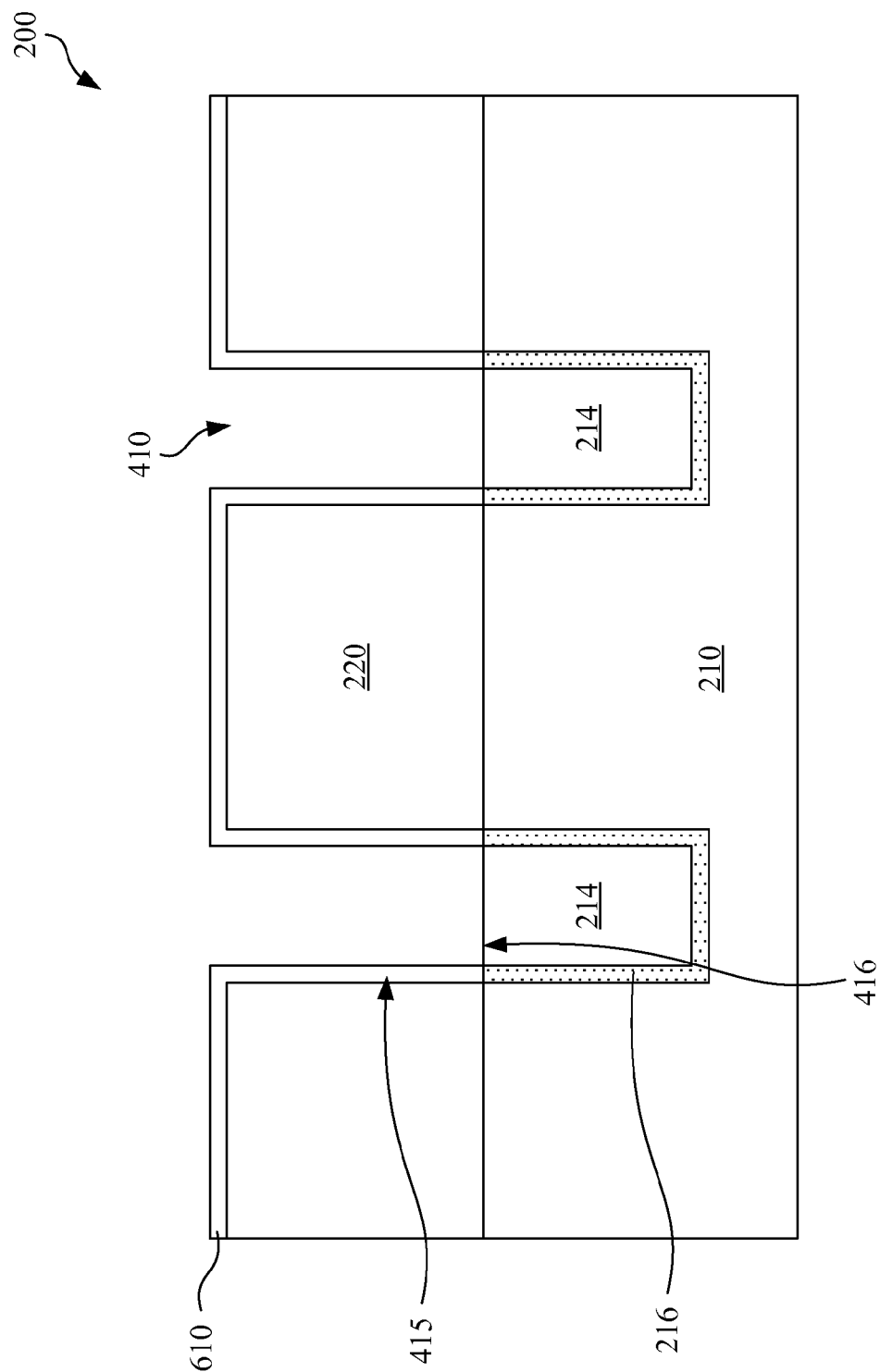

Referring to FIGS. 1 and 7, the method 100 proceeds to step 112 by removing the third barrier layer 620. In the present embodiment, a selective etch is performed such that the etch process etches the third barrier layer 620 without substantially etching the second barrier layer 610 and the conductive feature 214. A selective etch process provides process simplicity and relaxes process constrains. The selective etch may include a selective wet etch, a selective dry etch, and/or a combination thereof. As discussed above, in some embodiments, the third barrier layer 620 is formed of the same material as the first barrier layer 510, namely MnN, while the second barrier layer 610 is $MnSi_xO_yN_z$ and the first conductive feature is Cu. In such an embodiment, without substantially etching the $MnSi_xO_yN_z$ barrier layer 610, the MnN bottom-barrier layer 620 is removed by an aqueous wet clean process with a weak acid solution (pH value less than 7). The aqueous wet clean process adds simplicity to the manufacturing process and also minimizes process-induced-damage to the first conductive feature 214.

In the present embodiment, after removing the third barrier layer 620, the conductive feature 214 is exposed within vias 410. The second barrier layer 610 serves as a barrier layer for a metal layer to be filled in vias 410.

Figure 8A:
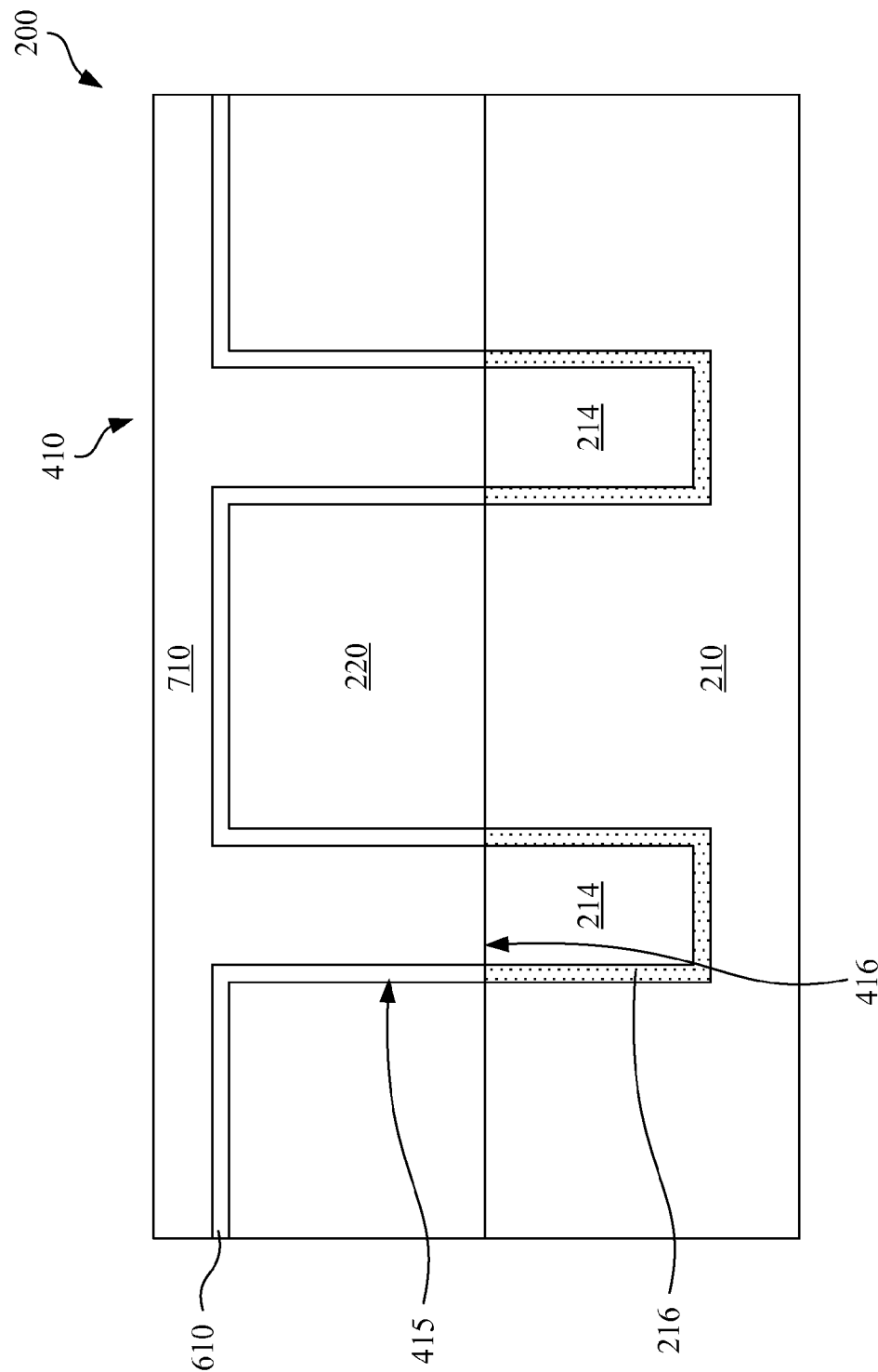

Referring to FIGS. 1 and 8A, the method 100 proceeds to step 114 by depositing a conductive layer 710 in vias 410. The conductive layer 710 may include metal layer, such as Cu, Co, W, Ru, Ag, Au, CoW, CoF, CoSi, or other suitable conductive material. The conductive layer 710 may be deposited by PVD, CVD, MOCVD, and/or plating. In one embodiment, the conductive layer 710 includes a copper layer deposited by PVD. In one embodiment, the conductive layer 710 includes a copper seed layer deposited by PVD and bulk copper layer by plating. In various other examples, copper deposition may be implemented by other techniques, such as PVD, CVD, MOCVD, or plating. A Cu reflow process may be added to enhance Cu filling profile.

As shown, the second barrier layer 610 separates the conductive layer 710 from the dielectric layer 220, along sidewalls 415 of vias 410, to serve as a barrier layer. It improves device reliability by limiting electron migration (EM) and time-dependent dielectric breakdown (TDDB) associated with metal diffusion into the underlying dielectric layer. At the bottom 416 of vias 410, the conductive layer 710 is deposited over and directly contacts the conductive feature 214. In another word, the conductive layer 710 is formed with a bottom-barrier-free structure.

Figure 8B:
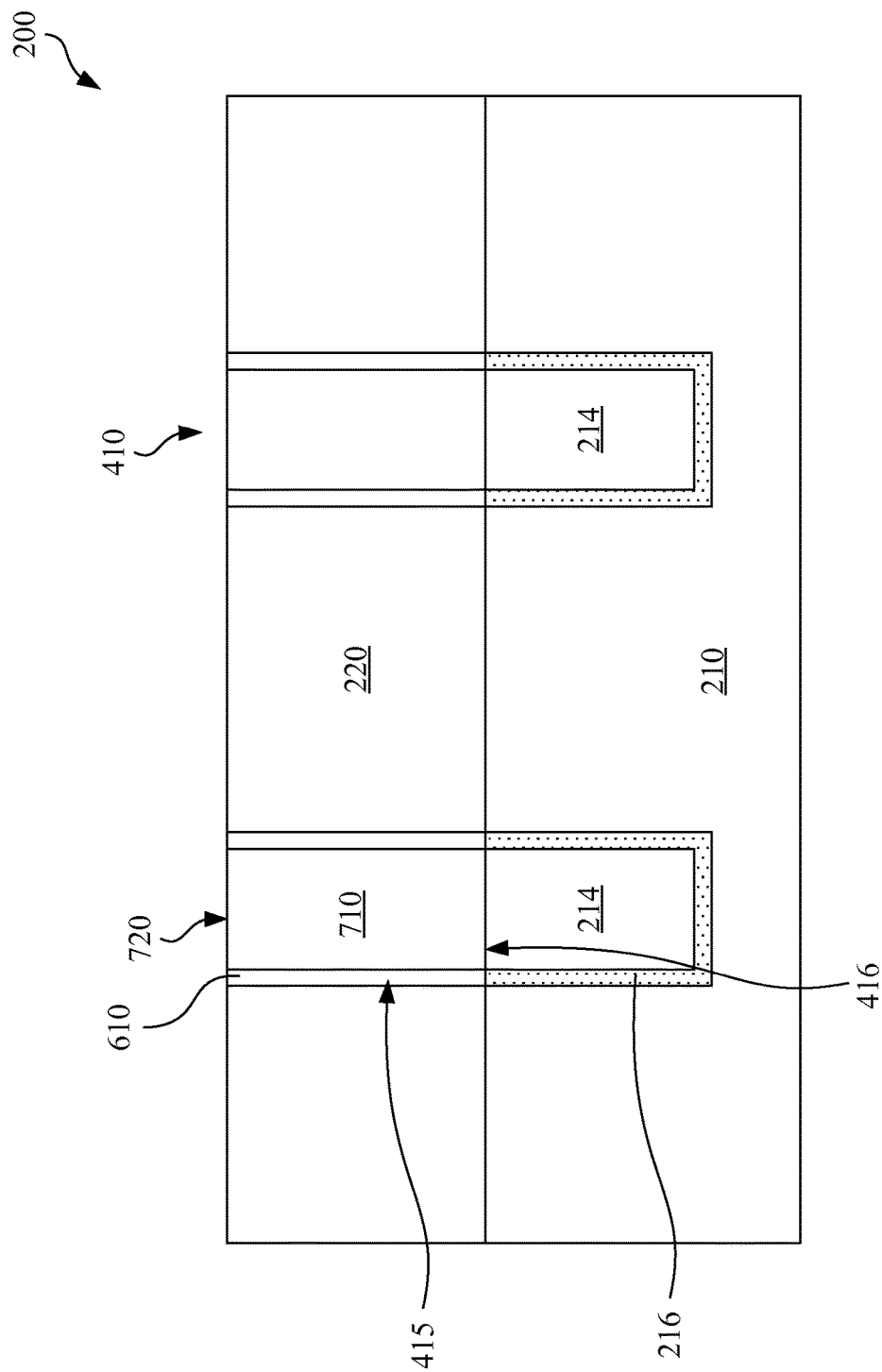

In some embodiments, a CMP process is performed to remove excessive second conductive layer 710 and the remaining second conductive layer 710 in the via 410 forms a conductive interconnection 720, as shown in FIG. 8B. The second barrier layer 610 over the dielectric layer 220 is removed by the CMP process as well. In one embodiment, the conductive interconnection 720 is a Cu interconnection. In the present embodiment, with a bottom-barrier-free structure, via resistance of the conductive interconnection 720 is reduced, and with the second barrier 610 as sidewalls barrier layer of the conductive connection 720, device reliability related with EM and TDDB is improved.

Additional steps can be provided before, during, and after the method 100, and some of the steps described can be replaced, eliminated, or moved around for additional embodiments of the method 100.

The semiconductor devices, 200, may include additional features, which may be formed by subsequent processing. For example, various vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Although not intended to be limiting, one or more embodiments of the present disclosure provide many benefits to a semiconductor device and the formation thereof. Based on the above, it can be seen that the present disclosure provide methods of forming a bottom-barrier-free metal interconnection for achieving low via resistance. The method employs applying a thermal treatment to a barrier layer to transform a portion of the barrier layer to be different than another portion of the barrier layer. The method also employs a selective etch to remove one of portions of the barrier layer, such as a bottom portion of the barrier layer. The method provides a robust metal interconnection formation process with selective formation and selective etching to relax process constrain and obtain process simplicity.

The present disclosure provides many different embodiments of fabricating a semiconductor device that provide one or more improvements over existing approaches. In one embodiment, a method for fabricating a semiconductor device includes forming a first conductive feature over a substrate, forming a dielectric layer over the first conductive feature, forming via trenches in the dielectric layer. The first conductive feature is exposed within via trenches. The method also includes forming a first barrier layer in via trenches. Therefore the first barrier has a first portion disposed over the dielectric layer and a second portion disposed over the first conductive feature, applying a thermal treatment to convert the first portion of the barrier layer to a second barrier layer and exposing the first conductive feature in the via trench while a portion of the second barrier layer is disposed over the dielectric layer.

In yet another embodiment, a method includes forming a dielectric layer over a first conductive feature disposed on a substrate, forming a trench in the dielectric layer, wherein the first conductive feature is exposed within the trench forming a first barrier layer in the trench. A first portion of the first barrier is formed along a sidewall surface of the trench defined by the dielectric layer and a second portion of the first barrier layer is formed along a bottom surface of the trench defined by the first conductive feature. The method also includes converting the first portion of the first barrier layer into a second barrier layer. The second barrier layer is formed of a different material than the first barrier layer. The method also includes exposing the first conductive feature in the trench while a portion of the second barrier layer is disposed over the dielectric layer and forming a second conductive feature in the trench.

In yet another embodiment, a semiconductor device includes a first conductive feature disposed over a substrate, a second conductive feature disposed over the first conductive feature. A bottom of the second conductive feature is in physical contact with a top portion of the first conductive feature. The device also includes a first barrier layer disposed along sidewalls of the second conductive feature and a dielectric layer disposed along the first barrier layer, wherein the dielectric layer is in physical contact with a side of the first barrier layer that faces away from the second conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first conductive feature in a semiconductor substrate, wherein the first conductive feature has a first sidewall and an opposing second sidewall and a first barrier layer is disposed along the first and second sidewalls such that the first conductive feature is separated from the semiconductor substrate by the first barrier layer;
    forming a dielectric layer over the first conductive feature and the first barrier layer;
    forming a via trench in the dielectric layer, wherein a portion of the first conductive feature and a portion of the first barrier layer are exposed within the via trench;
    forming a second barrier layer in the via trench directly on the dielectric layer, the portion of the first barrier layer and the portion of the first conductive feature, wherein the second barrier layer has a first portion disposed directly on the dielectric layer and a second portion disposed directly on the portion of the first conductive feature and the portion of the first barrier layer, wherein the second barrier layer is formed of manganese nitride;
    applying a thermal treatment to convert the first portion of the second barrier layer to a third barrier layer, wherein the third barrier layer and manganese nitride have different etching selectivity;
    exposing the portion of the first conductive feature in the via trench by removing the second portion of the second barrier layer while the first portion of the second barrier layer is disposed directly on the dielectric layer; and
    after the exposing the portion of the first conductive feature, forming a second conductive feature directly on the third barrier layer and the first conductive feature such that an interface between the first and second conductive features is free of manganese nitride.

2. The method of claim 1, wherein after applying the thermal treatment to convert the first portion to the third barrier layer, the second portion of the second barrier layer remains the same such that the third barrier layer is formed of a different material than the second portion of the second barrier layer.

3. The method of claim 1, wherein applying the thermal treatment to convert the first portion to the third barrier layer includes applying the thermal treatment to the second portion of the second barrier layer to chemically change a composition of the second portion of the second barrier layer such that the second portion of the second barrier layer is different than the third barrier layer.

4. The method of claim 1, wherein applying the thermal treatment to convert the first portion of the second barrier layer to the third barrier layer includes converting the manganese nitride to MnSixOyNz, where x represents Si composition in atomic percent, y represents oxygen composition in atomic percent and z represents nitrogen composition in atomic percent.

5. The method of claim 1, wherein the third barrier layer is disposed along the first sidewall and the opposing second sidewall of the via trench, and
    wherein the second conductive feature is formed of a conductive material that physically contacts the first conductive feature and extends continuously from the third barrier layer disposed along the first sidewall to the third barrier layer disposed along the second sidewall.

6. The method of claim 1, wherein forming the second barrier layer in the via trench includes forming the second barrier layer directly on a top surface of the dielectric layer, the top surface of the dielectric layer facing away from the substrate.

7. A method comprising:
forming a dielectric layer over a first conductive feature disposed in a semiconductor substrate, wherein the first conductive feature is surrounded by a first barrier layer in the semiconductor substrate;
forming a trench in the dielectric layer, wherein a portion of the first conductive feature and a portion of the first barrier layer are exposed within the trench;
forming a second barrier layer in the trench directly on the dielectric layer, the portion of the first barrier layer and the portion of the first conductive feature, wherein a first portion of the second barrier layer is formed along a sidewall surface of the trench defined by the dielectric layer and a second portion of the second barrier layer is formed along a bottom surface of the trench defined by the first conductive feature, the second barrier layer comprising manganese nitride;
converting the first portion of the second barrier layer into a third barrier layer, wherein the third barrier layer and manganese nitride have different etching selectivity;
exposing the first conductive feature in the trench by removing the second portion of the second barrier layer while a portion of the third barrier layer is disposed over the dielectric layer; and
forming a second conductive feature in the trench directly on the third barrier layer and the first conductive feature such that an interface between the first and second conductive features is free of manganese nitride.

8. The method of claim 7, wherein converting the first portion of the second barrier layer into the third barrier layer includes performing an annealing process on the second barrier layer.

9. The method of claim 7, wherein after converting the first portion of the second barrier layer into the third barrier layer the second portion of the second barrier layer remains the same such that the third barrier layer is formed of a different material than the second portion of the second barrier layer.

10. The method of claim 7, wherein the third barrier layer includes MnSixOyNz, where x represents Si composition in atomic percent, y represents oxygen composition in atomic percent and z represents nitrogen composition in atomic percent.

11. The method of claim 7, wherein exposing the first conductive feature in the trench includes removing the second portion of the second barrier layer by performing a wet etch process that includes an acid.

12. The method of claim 7, wherein forming the second conductive feature in the trench includes:
forming a conductive layer in the trench directly on the first conductive feature; and
planarizing the conductive layer to form the second conductive feature.

13. The method of claim 7, wherein a third portion of the second barrier layer is formed along another sidewall surface of the trench defined by the dielectric layer, the another sidewall surface opposing the sidewall surface,
wherein converting the first portion of the second barrier layer into the third barrier layer includes converting the third portion of the second barrier into the third barrier layer,
wherein the third barrier layer is disposed along a sidewall surface and the another sidewall surface, and wherein the second conductive feature is formed of a conductive material that physically contacts the first conductive feature and extends continuously from the third barrier layer disposed along the sidewall surface to the third barrier layer disposed along the another sidewall surface.

14. The method of claim 8, wherein the anneal process is selected from a group consisting of a rapid thermal anneal process, a laser anneal process, a furnace anneal process, and a flash lamp anneal process.

15. The method of claim 8, wherein a temperature range of the anneal process is from about 100° C. to about 400° C.

16. The method of claim 7, wherein the portion of the first barrier layer has a top surface facing away from the substrate, and
wherein forming the second barrier layer in the trench directly on the portion of the first barrier layer includes forming the second barrier layer directly on the top surface of the portion of the first barrier layer.

17. A method comprising:
forming a via through a dielectric layer to a conductive feature disposed in a semiconductor substrate, wherein the conductive feature has a first sidewall and an opposing second sidewall and a first barrier layer is disposed along the first and second sidewalls such that the first conductive feature is separated from the semiconductor substrate by the first barrier layer;
forming a second barrier layer in the via and directly on the conductive feature and the first barrier layer, the second barrier layer being formed of manganese nitride;
performing a thermal treatment on the second barrier layer to form a third barrier layer by reacting with the dielectric layer and a fourth barrier layer by reacting with the conductive feature, wherein the third barrier layer is different from the fourth barrier layer, and wherein the third barrier layer and manganese nitride have different etching selectivity;
selectively removing the fourth barrier layer to expose the conductive feature; and
forming a second conductive layer to fill in the via such that an interface between the second conductive layer and the conductive feature is free of manganese nitride and the second conductive layer is in direct contact with the second barrier layer.

18. The method of claim 17, wherein the performing a thermal treatment includes:
forming the third barrier layer comprising MnSixOyNz layer, where x represents Si composition in atomic percent, y represents oxygen composition in atomic percent and z represents nitrogen composition in atomic percent; and
forming the fourth barrier layer comprising manganese nitride layer.

19. The method of claim 18, wherein the selectively removing the fourth barrier layer includes removing the manganese nitride layer without etching the MnSixOyNz layer by an aqueous wet clean process with a weak acid solution having pH value less than 7.

20. The method of claim 17, wherein the first barrier layer has a top surface facing away from the substrate, and
wherein forming the second barrier layer in the via directly on the conductive feature and the first barrier layer includes forming the second barrier layer directly on the top surface of the first barrier layer.

* * * * *